US010177720B2

(12) United States Patent
Nicollini et al.

(10) Patent No.: US 10,177,720 B2
(45) Date of Patent: Jan. 8, 2019

(54) AMPLIFYING ELECTRONIC CIRCUIT WITH REDUCED START-UP TIME FOR A SIGNAL INCLUDING QUADRATURE COMPONENTS

(71) Applicant: STMICROELECTRONICS S.R.L., Agrate Brianza (IT)

(72) Inventors: Germano Nicollini, Piacenza (IT); Marco Garbarino, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 151 days.

(21) Appl. No.: 15/156,172

(22) Filed: May 16, 2016

(65) Prior Publication Data

US 2017/0187335 A1     Jun. 29, 2017

(30) Foreign Application Priority Data

Dec. 23, 2015    (IT) ........................ 102015000087433

(51) Int. Cl.
*H03F 1/34*       (2006.01)
*G01C 19/56*      (2012.01)
(Continued)

(52) U.S. Cl.
CPC .............. *H03F 1/34* (2013.01); *G01C 19/56* (2013.01); *G01C 19/5776* (2013.01); *H03F 1/303* (2013.01); *H03F 3/45071* (2013.01); *H03F 3/45475* (2013.01); *H03F 3/70* (2013.01); *H03K 5/1536* (2013.01); *H03K 17/22* (2013.01); *H03F 2200/144* (2013.01); *H03F 2200/336* (2013.01); *H03F 2203/45044* (2013.01);
(Continued)

(58) Field of Classification Search
USPC ......................................... 330/69, 9, 109, 86
See application file for complete search history.

(56) References Cited

U.S. PATENT DOCUMENTS 6,253,612 B1 *  7/2001  Lemkin .................. G01C 19/56
                                                          73/504.02
7,944,288 B2 *  5/2011  Ummelmann ..... G01R 19/0023
                                                          330/109

(Continued)

FOREIGN PATENT DOCUMENTS

EP       1 840 508 A2    10/2007
EP       1 959 562 A1    8/2008
(Continued)

*Primary Examiner* — Hieu Nguyen
(74) *Attorney, Agent, or Firm* — Seed Intellectual Property Law Group LLP (57) ABSTRACT

An electronic circuit for amplifying signals with two components in phase quadrature, which includes: a feedback amplifier with a feedback capacitor; a switch that drives charging and discharging of the feedback capacitor; an additional capacitor; and a coupling circuit, which alternatively connects the additional capacitor in parallel to the feedback capacitor or else decouples the additional capacitor from the feedback capacitor. The switch opens at a first instant, where a first one of the two components assumes a first zero value; the coupling circuit decouples the additional capacitor from the feedback capacitor in a way synchronous with a second instant, where the first component assumes a second zero value.

30 Claims, 8 Drawing Sheets

(51) Int. Cl.
H03K 5/1536 (2006.01)
H03K 17/22 (2006.01)
H03F 3/45 (2006.01)
H03F 1/30 (2006.01)
H03F 3/70 (2006.01)
G01C 19/5776 (2012.01)

(52) U.S. Cl.
CPC ............. *H03F 2203/45112* (2013.01); *H03F 2203/45514* (2013.01); *H03F 2203/45526* (2013.01); *H03F 2203/45528* (2013.01); *H03F 2203/45534* (2013.01); *H03F 2203/45536* (2013.01)

(56) References Cited

U.S. PATENT DOCUMENTS

| | | | |
|---|---|---|---|
| 8,497,746 B2 * | 7/2013 | Visconti | H03H 11/126 327/337 |
| 8,599,053 B2 * | 12/2013 | Quiquempoix | H03F 3/005 341/143 |
| 2006/0087370 A1 | 4/2006 | Tsuruhara et al. | |

FOREIGN PATENT DOCUMENTS

| EP | 2 259 019 A1 | 12/2010 |
|---|---|---|
| EP | 2 648 334 A1 | 10/2013 |

* cited by examiner

AMPLIFYING ELECTRONIC CIRCUIT WITH REDUCED START-UP TIME FOR A SIGNAL INCLUDING QUADRATURE COMPONENTS

BACKGROUND

Technical Field

The present disclosure relates to an amplifying electronic circuit, which has a reduced start-up time and is designed to amplify a signal including quadrature components.

Description of the Related Art

As is known, today it is widespread practice to use capacitive-feedback amplifiers, i.e., to use circuit schemes in which an operational amplifier is fed back with a capacitor. This configuration guarantees in fact a reduction of thermal noise and power consumption.

In general, capacitive-feedback amplifiers suffer from the problem of having the input terminals without d.c. biasing. This problem is typically solved by adding a resistor with high resistance (for example, of the order of tens of gigaohms) in the feedback network or else, if the amplifier is designed for discontinuous use in time, by using a switch, which is controlled for enabling reset of the circuit formed by the amplifier and by the corresponding feedback network, before each power-up. In particular, in the case of use of a switch, typically it is arranged in such a way that, when it is closed, it shorts the terminals of the feedback capacitor.

In the case of use of a switch, it is possible for problems to arise if a non-zero signal is present at input to the amplifier at the moment when the switch is released. To understand this problem in detail, it should be recalled how, in the case of capacitive-feedback amplifiers, present on the input terminals of the amplifier is at least one input capacitor, which, whenever the switch is released (i.e., the reset is removed), charges as a function of the value of the signal present at input upon release of the switch. This charging represents a d.c. error, which falsifies the output of the circuit and vanishes only after a period of time that is equal to several times the time constant associated to the feedback capacitor. Typically, the aforementioned period of time may be rather long. For instance, in the case of absence of the feedback resistor, the time constant is given by the product of the capacitance of the feedback capacitor and of the resistance introduced by the switch, when open; consequently, the time constant may be of the order of seconds or tens of seconds. Instead, in the presence of a feedback resistor that is arranged in parallel to the feedback capacitor and has a resistance of the order of tens of gigaohms, the time constant may be of the order of tens of milliseconds.

BRIEF SUMMARY

In one or more embodiments, the present disclosure provides amplifying electronic circuits and methods that solve at least in part the drawbacks of the known art.

In one or more embodiments, an electronic circuit is provided that includes a first input capacitor including first and second terminals, the first terminal being configured to receive an input signal having first and second input components, the first and second input components having a same period and being in phase quadrature with respect to one another; an amplifier including a first input terminal and a first output terminal, the first input terminal being coupled to the second terminal of the first input capacitor; a first feedback capacitor coupled between the first input terminal and the first output terminal of the amplifier; a first switch coupled between the first input terminal and the first output terminal of the amplifier; and a first coupling circuit including a second switch, a third switch and a first startup capacitor, the second switch being coupled between the first input terminal of the amplifier and a first terminal of the first startup capacitor, the third switch being coupled between a second terminal of the first startup capacitor and the first output terminal of the amplifier.

BRIEF DESCRIPTION OF THE SEVERAL VIEWS OF THE DRAWINGS

For a better understanding of the present disclosure, preferred embodiments are described, purely to way of non-limiting example and with reference to the attached drawings, wherein.

DETAILED DESCRIPTION

Figure 1:
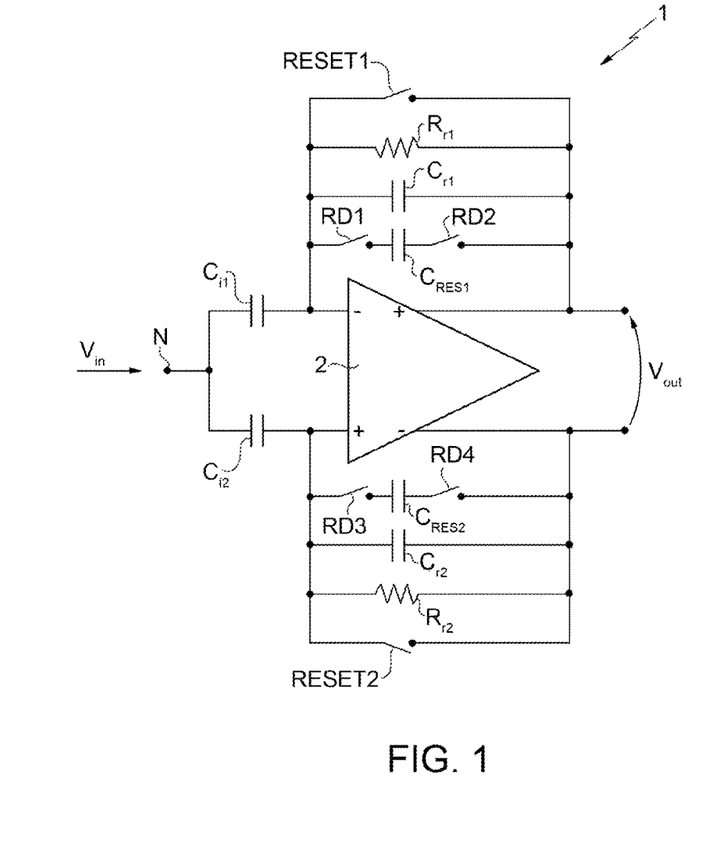
FIGS. 1, 4, 7 and 8 show circuit diagrams of embodiments of the present amplifying circuit.

FIG. 1 shows an amplifying circuit 1, which comprises an amplifier 2 formed, for example, by an operational amplifier with differential output.

The amplifying circuit 1 further comprises a first feedback resistor $R_{r1}$ and a second feedback resistor $R_{r2}$, which have to a first approximation one and the same value of resistance R (for example, comprised between 1 G$\Omega$ and 100 G$\Omega$), as well as a first feedback capacitor $C_{r1}$ and a second feedback capacitor $C_{r2}$, which have to a first approximation one and the same value of capacitance $C_2$ (for example, comprised between 0.1 pF and 10 pF).

Further, the amplifying circuit 1 comprises a first switch RESET1, a second switch RD1, and a third switch RD2, and a further capacitor $C_{RES1}$, referred to hereinafter as the first start-up capacitor $C_{RES1}$ since its operation will affect the duration of the start-up period, as described hereinafter. The first start-up capacitor $C_{RES1}$ has the same value of capacitance $C_2$ as the first feedback capacitor $C_{r1}$ (and thus also as the second feedback capacitor $C_{r2}$).

For greater clarity, in what follows the first, second, and third switches RESET1, RD1, RD2 will be referred to as the first main switch RESET1, the first secondary switch RD1, and the second secondary switch RD2, respectively.

In greater detail, the first feedback resistor $R_{r1}$ and the first feedback capacitor $C_{r1}$ are connected in parallel; further, each of them has a respective first terminal, connected to a first input terminal of the amplifier 2 (for example, the negative input terminal), and a respective second terminal, connected to a first output terminal of the amplifier 2 (for example, the positive output terminal). Furthermore, the first main switch RESET1 is connected in parallel to the first feedback resistor $R_{r1}$ and to the first feedback capacitor $C_{r1}$, in such a way that, when it is closed, it shorts the first input terminal and the first output terminal of the amplifier 2.

The first start-up capacitor $C_{RES1}$ and the first and second secondary switches RD1, RD2 form a series circuit, which is arranged in parallel to the first feedback resistor $R_{r1}$ and to the first feedback capacitor $C_{r1}$ and is such that the first start-up capacitor $C_{RES1}$ is arranged between the first and second secondary switches RD1, RD2. In addition, when the first and second secondary switches RD1, RD2 are closed, the first start-up capacitor $C_{RES1}$ is arranged in parallel to the first feedback capacitor $C_{r1}$, and when the first and second secondary switches RD1, RD2 are open, the first start-up capacitor $C_{RES1}$ is disconnected from the amplifying circuit 1.

The second feedback resistor $R_{r2}$ and the second feedback capacitor $C_{r2}$ are connected in parallel. Further, each of them has a respective first terminal, connected to a second input terminal of the amplifier 2 (for example, the positive input terminal), and a respective second terminal, connected to a second output terminal of the amplifier 2 (for example, the negative output terminal).

The amplifying circuit 1 further comprises a fourth switch RESET2, a fifth switch RD3, and a sixth switch RD4, and a further capacitor $C_{RES2}$, referred to hereinafter as the second start-up capacitor $C_{RES2}$. The second start-up capacitor $C_{RES2}$ has the same value of capacitance $C_2$ as the second feedback capacitor $C_{r2}$ (and thus also as the first feedback capacitor $C_{r1}$ and as the first start-up capacitor $C_{RES1}$).

For greater clarity, in what follows the fourth, fifth, and sixth switches RESET2, RD3, RD4, will be referred to as the second main switch RESET2, the third secondary switch RD3, and the fourth secondary switch RD4, respectively.

The second main switch RESET2 is connected in parallel to the second feedback resistor $R_{r2}$ and to the second feedback capacitor $C_{r2}$ in such a way that, when it is closed, it shorts the second input terminal and the second output terminal of the amplifier 2.

The second start-up capacitor $C_{RES2}$ and the third and fourth secondary switches RD3, RD4 form a series circuit, which is arranged in parallel to the second feedback resistor $R_{r2}$ and to the second feedback capacitor $C_{r2}$ and is such that the second start-up capacitor $C_{RES2}$ is arranged between the third and fourth secondary switches RD3, RD4. Furthermore, when the third and fourth secondary switches RD3, RD4 are closed, the second start-up capacitor $C_{RES2}$ is arranged in parallel to the second feedback capacitor $C_{R2}$, and when the third and fourth secondary switches RD3, RD4 are open, the second start-up capacitor $C_{RES2}$ is disconnected from the amplifying circuit 1.

The amplifying circuit 1 further comprises a further pair of capacitors, referred to hereinafter as the first and second input capacitors $C_{i1}$, $C_{i2}$. The first and second input capacitors $C_{i1}$, $C_{i2}$ have values of capacitance respectively equal to $C_1+\Delta C$ and $C_1-\Delta C$, where $\Delta C \ll C_1$ (for example, $\Delta C = 0.01 \cdot C_1$). Without any loss of generality, the first and second input capacitors $C_{i1}$, $C_{i2}$ may have variable capacitance. Thus, they may be such that $\Delta C$ may be varied in time. For simplicity, in the sequel of the present description it is assumed, however, that $\Delta C$ is fixed, except where otherwise specified.

In greater detail, both the first input capacitor $C_{i1}$ and the second input capacitor $C_{i2}$ have a respective terminal, which is connected to an input node N. Further, the second terminals of the first and second input capacitors $C_{i1}$, $C_{i2}$ are connected, respectively, to the first and second input terminals of the amplifier 2. The amplifier 2 thus functions as fully differential amplifier, i.e., with differential input and differential output.

In use, the input node N is apt to receive an input signal $V_{in}$, which is, for example, a voltage signal of a single-ended type. Furthermore, the input signal $V_{in}$ is equal to the sum of two voltages, shown in FIG. 2, where they are denoted, respectively, by $V_{QUAD\_in}$ and $V_{COR\_in}$. In what follows, the voltages $V_{COR\_in}$ and $V_{QUAD\_in}$ will be referred to as the first and second input components $V_{COR\_in}$, $V_{QUAD\_in}$, respectively.

Figure 2:
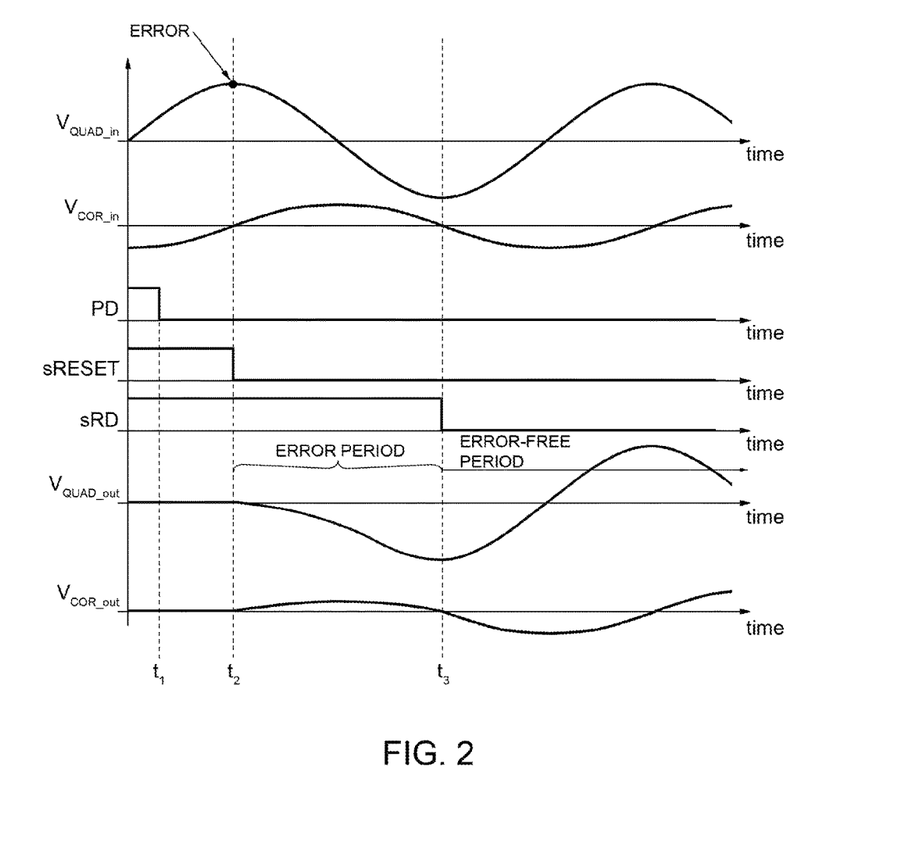
FIGS. 2, 6, 9 and 10 show time plots of signals present in corresponding embodiments of the present amplifying circuit.

In greater detail, the first and second input components $V_{COR\_in}$, $V_{QUAD\_in}$ are of a sinusoidal type, and the corresponding phases are in quadrature.

Figure 3:
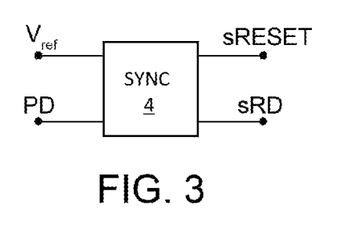
FIGS. 3 and 5 show block diagrams of synchronization circuits that may be coupled to embodiments of the present amplifying circuit.

FIG. 3 shows a circuitry 4, which in what follows will be referred to as the synchronization circuitry 4. The relations between the synchronization circuitry 4 and the amplifying circuit 1 will be described hereinafter.

In detail, the synchronization circuitry 4 has a first input, a second input, and two outputs. Further, the synchronization circuitry 4 is apt to receive on the first input a reference signal $V_{ref}$ formed, for example, by a sinusoidal voltage. The reference signal $V_{ref}$ is in phase with the second input component $V_{QUAD\_in}$. On the second input, the synchronization circuitry 4 receives an power-up/power-down signal PD, of a digital type, which is described hereinafter.

In greater detail, the synchronization circuitry 4 is apt to generate on its own outputs a first control signal sRESET and a second control signal sRD (represented in FIG. 2), which are, for example, voltage signals of a digital type. The first and second control signals sRESET, sRD are described hereinafter. The synchronization circuitry 4 may be formed in a per se known manner as a function of the first and second control signals sRESET, sRD, as clarified hereinafter.

Even though the corresponding connections are not shown, the first control signal sRESET drives the first and second main switches RESET1, RESET2, which operate in a synchronous way with respect to one another, whereas the second control signal sRD drives the first, second, third, and fourth secondary switches RD1, RD2, RD3, RD4, which thus operate in a synchronous way with respect to one another.

In particular, when sRESET='1', the first and second main switches RESET1, RESET2 are closed; instead, when sRESET='0', the first and second main switches RESET1, RESET2 are open. Furthermore, when sRD='1', the first, second, third, and fourth secondary switches RD1, RD2, RD3, RD4 are closed; instead, when sRD='0', the first, second, third, and fourth secondary switches RD1, RD2, RD3, RD4 are open.

This having been said, also visible in FIG. 2 is the aforementioned power-up/power-down signal PD. Even though not shown in detail, the power-up/power-down signal PD drives power-up of the amplifier 2; in particular, the amplifier 2 is turned on when PD='0', and is turned off when PD='1'.

Further visible in FIG. 2 is a first instant of time $t_1$, in which the amplifier 2 is turned on; i.e., the power-up/power-down signal PD goes to zero.

Once again with reference to the first and second control signals sRESET and sRD, the first control signal sRESET is synchronous with the first input component $V_{COR\_in}$. In particular, the first control signal sRESET is set equal to '1' for resetting the amplifier 2 and goes to zero at a second instant $t_2$, where the first input component $V_{COR\_in}$ exhibits the first zero subsequent to power-up of the amplifier 2. In this connection, also possible are embodiments (not shown) in which the first control signal sRESET switches to zero when the first input component $V_{COR\_in}$ exhibits a zero subsequent to the first zero that follows power-up of the amplifier 2, but this entails an increase in the start-up time. Consequently, in what follows, this case is not described any further.

The second control signal sRD is also synchronous with the first input component $V_{COR\_in}$. In particular, the second control signal sRD is set equal to '1', for example together with the first control signal sRESET, and goes to zero at a third instant in time $t_3$, where the first input component $V_{COR\_in}$ exhibits the second zero subsequent to power-up of the amplifier 2. In the example shown in FIG. 2, the second input component $V_{QUAD\_in}$ exhibits, at the second instant $t_2$ and the third instant $t_3$, a maximum and a minimum, respectively.

Once again with reference to the synchronization circuitry 4, it may be implemented in a per se known manner for generating the first and second control signals sRESET, sRD, as described previously. For this purpose, even though it is not shown, it may include a squaring circuit and one or more frequency dividers, since the first and second control signals sRESET, sRD are synchronous with the first input component $V_{COR\_in}$, and thus also with the second component input $V_{QUAD\_in}$, but have lower frequencies.

This having been said, at the second instant $t_2$, the first and second main switches RESET1, RESET2 open, and thus the first and the second feedback capacitors $C_{r1}$, $C_{r2}$ start to charge. Consequently, between the first and second output terminals of the amplifier 2 an output voltage $V_{out}$ is generated, which is of a differential type and is equal to the sum of a first output component $V_{COR\_out}$ and a second output component $V_{QUAD\_out}$, the plots of which are shown in FIG. 2.

In detail, in the period of time between the second and third instants $t_2$, $t_3$, referred to in what follows as the error period, the gain between the output voltage $V_{out}$ and the input signal $V_{in}$ is equal to $G_1 = -2\Delta C/(2C_2)$ since the first and second start-up capacitors $C_{RES1}$, $C_{RES2}$ are in parallel to the first and second feedback capacitors $C_{r1}$, $C_{r2}$, respectively.

In greater detail, in the error period, the first and second input components $V_{COR\_in}$, $V_{QUAD\_in}$ are amplified in an incorrect way, where by "correct amplification" is meant the case where $V_{COR\_out} = G_2 \cdot V_{COR\_in}$ and $V_{QUAD\_out} = G_2 \cdot V_{QUAD\_in}$, with $G_2 = -2\cdot\Delta C/C_2$. In fact, the first and second input components $V_{COR\_in}$, $V_{QUAD\_in}$ are amplified by $G_1$, instead of by $G_2$, i.e., by a gain that is equal to one half of the correct gain. Furthermore, we have $V_{QUAD\_out} = G_1 \cdot (V_{QUAD\_in} - ERR)$, where ERR is the initial error due to the fact that, at the second instant in time $t_2$, the second input component $V_{QUAD\_in}$ is not zero, unlike the first input component $V_{COR\_in}$. This initial error is, in fact, equal to the value assumed by the second input component $V_{QUAD\_in}$ at the second instant in time $t_2$. In other words, at the second instant $t_2$, not only is the second input component $V_{QUAD\_in}$ amplified with an incorrect gain, but further the result is affected by a sort of offset. In other words still, at the second instant $t_2$, the second output component $V_{QUAD\_out}$ assumes a value different from a corresponding first ideal value, equal to the product of the gain $G_2$ and the value that the second input component $V_{QUAD\_in}$ assumes at the second instant $t_2$.

The time interval that starts with the third instant $t_3$ is referred to as the error-free period. In fact, in this period the amplifying circuit 1 amplifies in a correct way; i.e., we have $V_{COR\_out} = G_2 \cdot V_{COR\_in}$ and $V_{QUAD\_out} = G_2 \cdot V_{QUAD\_in}$.

In detail, during the error-free period, the first and second start-up capacitors $C_{RES1}$, $C_{RES2}$ are disconnected from the amplifier 2, and consequently the first and second input components $V_{COR\_in}$, $V_{QUAD\_in}$ are correctly amplified by $G_2$.

In greater detail, at the third instant $t_3$, the first output component $V_{COR\_out}$ is correctly equal to zero. Further, once again at the third instant $t_3$, the second output component $V_{QUAD\_out}$ is exactly equal to $G_2 \cdot V_{QUAD\_in}$. In fact, during the error period, the deviation between the erroneous profile of the second output component $V_{QUAD\_out}$ and the corresponding correct profile reduces, until it vanishes at the third instant $t_3$. In other words, at the third instant $t_3$, the effects of the initial error and of the incorrect gain $G_1$ on the second output component $V_{QUAD\_out}$ compensate one another, cancelling each other out. Consequently, at the third instant $t_3$, the second output component $V_{QUAD\_out}$ assumes a value equal to a corresponding second ideal value, equal to the product of the gain $G_2$ and the value that the second input component $V_{QUAD\_in}$ assumes at the third instant $t_3$.

Furthermore, as explained previously, at the third instant $t_3$ also the first output component $V_{QUAD\_out}$ assumes a correct value (zero).

In other words, in the error-free period, not only is the gain correct, but further any undesired offset is absent, since the values assumed by the first and second output components $V_{COR\_out}$, $V_{QUAD\_out}$ at the third instant $t_3$ are correct.

Once again with reference to FIG. 2, purely by way of example, it has been assumed, to facilitate understanding, that $G_1 = -\frac{1}{2}$ and $G_2 = -1$; i.e., it has been assumed that the amplifying circuit 1 has a unit gain.

In practice, the embodiment shown in FIG. 1 has a start-up time equal to half of the period of the first and second input components $V_{COR\_in}$ and $V_{QUAD\_in}$. It is thus possible to turn the amplifier 2 off and back on in order to reduce consumption, without this entailing the risk of having to wait, following upon each power-up, for an excessively long period of time before obtaining correct values of the output voltage $V_{out}$. In this connection, for simplicity, FIG. 2 does not show either powering-down of the amplifier 2 or its subsequent powering-up.

Figure 4:
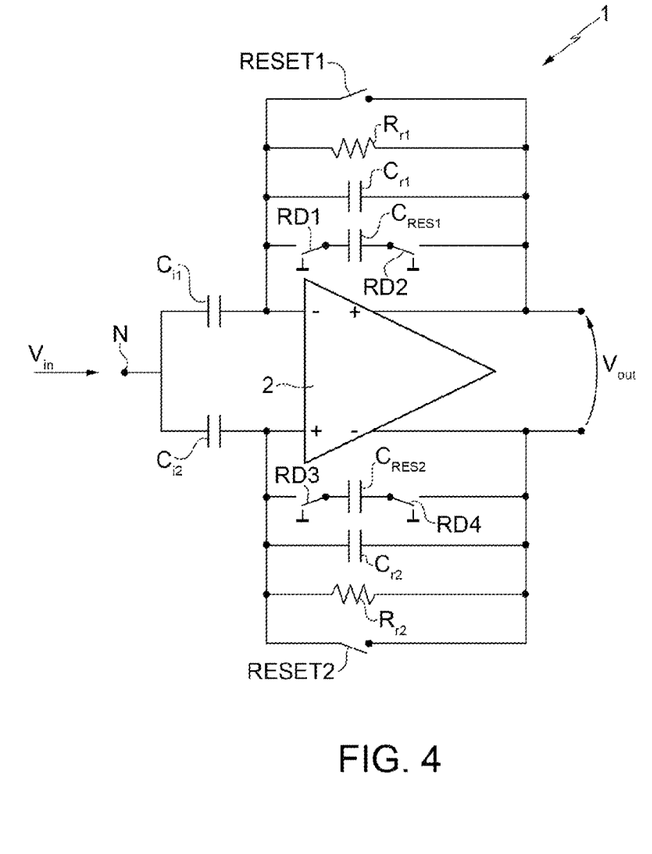

FIG. 4 shows a different embodiment. Components already present in the embodiment illustrated in FIG. 1 are referred to using the same terms and the same references. Further, the first and second start-up capacitors $C_{RES1}$, $C_{RES2}$ and the first and second feedback capacitors $C_{r1}$, $C_{r2}$ again have the same values of capacitance (compatibly with the inevitable tolerances), i.e., a value equal to $C_2$. This having been said, in what follows the embodiment shown in FIG. 4 is described with reference to the differences as compared to the embodiment shown in FIG. 1.

The first, second, third, and fourth secondary switches RD1, RD2, RD3, RD4 are arranged in a way different from the embodiment illustrated in FIG. 1.

In particular, the first start-up capacitor $C_{RES1}$ is once again arranged between the first and second secondary switches RD1, RD2. However, the first secondary switch RD1 is configured to connect a first terminal of the first start-up capacitor $C_{RES1}$ alternatively to the first input terminal of the amplifier 2 or else to ground. Likewise, the second secondary switch RD2 is configured to connect a second terminal of the first start-up capacitor $C_{RES1}$ alternatively to the first output terminal of the amplifier 2 or else to ground.

The second start-up capacitor $C_{RES2}$ is again arranged between the third and fourth secondary switches RD3, RD4. However, the third secondary switch RD3 is configured to connect a first terminal of the second start-up capacitor $C_{RES2}$ alternatively to the second input terminal of the amplifier 2 or else to ground. Likewise, the fourth secondary switch RD4 is configured to connect a second terminal of the second start-up capacitor $C_{RES2}$ alternatively to the second output terminal of the amplifier 2 or else to ground.

Figure 5:
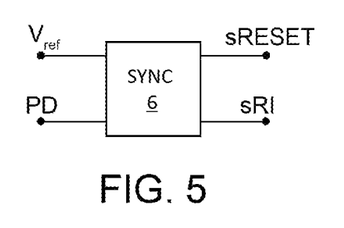

In greater detail, the amplifying circuit of the embodiment shown in FIG. 4 is controlled by the signals generated by the synchronization circuit shown in FIG. 5, where it is designated by 6. In particular, the synchronization circuit 6 is configured to generate, as a function of the reference signal $V_{ref}$ and of the power-up/power-down signal PD, the first control signal sRESET and a third control signal sRI, also the latter signal being a voltage signal of a digital type. The third control signal sRI is synchronized with the first input component $V_{COR\_in}$, as described in detail hereinafter.

In greater detail, albeit not shown, the first, second, third, and fourth secondary switches RD1, RD2, RD3, RD4 are driven by the third control signal sRI, and thus operate in a way synchronous with respect to one another.

In particular, the first and second secondary switches RD1, RD2 are driven in such a way that, when sRI='0', the terminals of the first start-up capacitor $C_{RES1}$ are connected to ground; thus, the first start-up capacitor $C_{RES1}$ does not have any effect on the gain of the amplifying circuit 1; instead, when sRI='1', the first start-up capacitor $C_{RES1}$ is connected in parallel to the first feedback capacitor $C_{r1}$.

The third and fourth secondary switches RD3, RD4 are driven in such a way that, when sRI='0', the terminals of the second start-up capacitor $C_{RES2}$ are connected to ground. Thus, the second start-up capacitor $C_{RES2}$ does not have any effect on the gain of the amplifying circuit 1. Instead, when sRI='1', the second start-up capacitor $C_{RES2}$ is connected in parallel to the second feedback capacitor $C_{r2}$.

Figure 6:
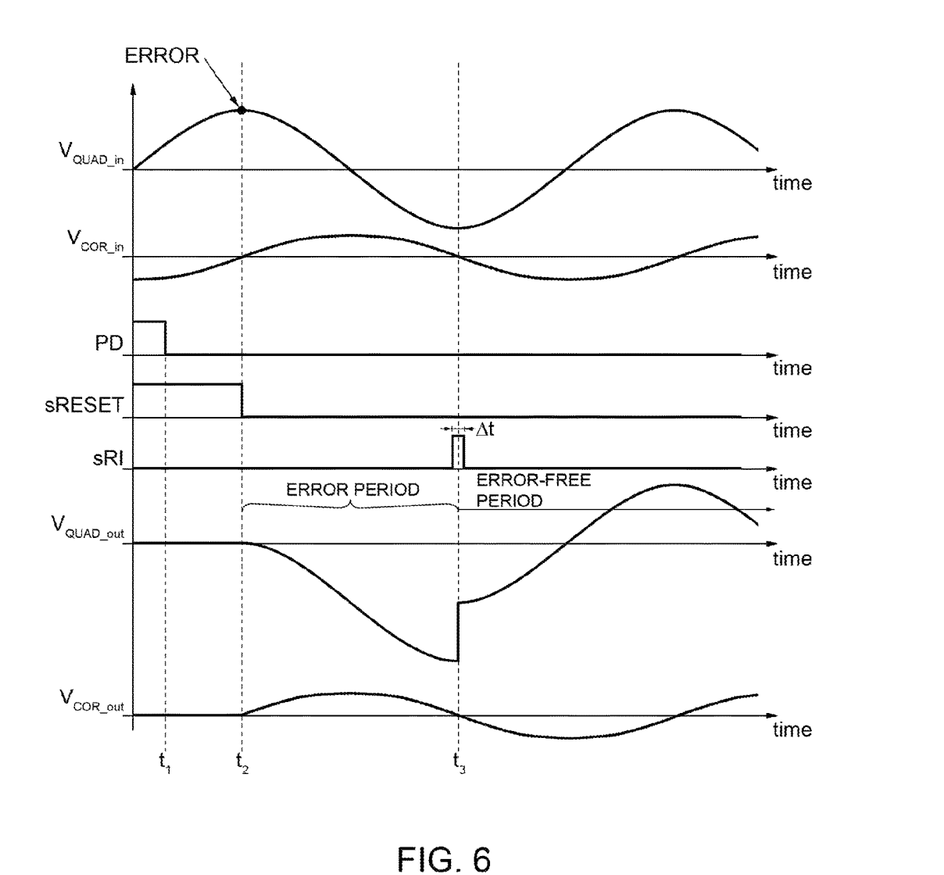

In use, as shown in FIG. 6, the first control signal sRESET goes once again to zero at the second instant $t_2$, where the first input component $V_{COR\_in}$ exhibits the first zero subsequent to power-up of the amplifier 2. Consequently, the first and second main switches RESET1, RESET2 are driven as in the embodiment shown in FIG. 1.

As regards the third control signal sRI, it is always again equal to '0', except in a time window of duration $\Delta t$, centered around the third instant $t_3$, where it assumes the value '1'.

In practice, the third control signal sRI forms a unit pulse, which, without any loss of generality, extends in time symmetrically around the third instant $t_3$, where the first input component $V_{COR\_in}$ exhibits the second zero subsequent to power-up of the amplifier 2. Consequently, the first and second start-up capacitors $C_{RES1}$, $C_{RES2}$ are arranged in parallel, respectively, to the first and second feedback capacitors $C_{r1}$, $C_{r2}$ only during the aforementioned time window; otherwise, they are set to ground. In this connection, assuming that the period of the first and second input components $V_{COR\_in}$, $V_{QUAD\_in}$ is of the order of tens of microseconds (for example, 40 µs), $\Delta t$ may be of the order of tenths of microseconds (for example, 0.1 µs). In greater detail, the ratio between $\Delta t$ and the period of the first and second input components $V_{COR\_in}$, $V_{QUAD\_in}$ may be lower, for example, than 1/50 or else 1/100. In the sequel of the present description, for simplicity, it is assumed that $\Delta t$ has an infinitesimal duration, except where otherwise specified.

In detail, the error period extends once again between the second and third instants $t_2$, $t_3$, whereas the error-free period extends one again from the third instant $t_3$. Both in the error period and in the error-free period, the gain introduced by the amplifying circuit 1 is correct; i.e., it is equal to the aforementioned value $G_2$, except during the aforementioned time window of the third control signal sRI, where, that is, the gain assumes the aforementioned value $G_1$, i.e., it is halved.

The first output component $V_{COR\_out}$ thus has a correct profile both in the error period and in the error-free period. In fact, halving of the gain at the pulse of the third control signal sRI does not affect the first output component $V_{COR\_out}$ since, during this pulse, the first input component $V_{COR\_in}$ is substantially zero.

As regards, instead, the second output component $V_{QUAD\_out}$, in the error period it has a correct profile, but for an offset that remains constant throughout the duration of the error period, said offset being caused by the fact that, upon release of the first and second main switches RESET1, RESET2, the second input component $V_{QUAD\_in}$ is not zero. This offset goes to zero following upon the pulse of the third control signal sRI thanks to halving of the gain.

More in particular, to a first approximation, the aforementioned offset goes to zero immediately after the rising edge of the pulse of the third control signal sRI. Furthermore, considering the reduced temporal duration of the pulse of the third control signal sRI, it may be assumed that, following upon the rising edge of the pulse of the third control signal sRI, the second output component $V_{QUAD\_out}$ assumes a value equal to a corresponding ideal value that is equal to the product of the gain $G_2$ and the value that the second input component $V_{QUAD\_in}$ assumes at the third instant $t_3$. In addition, it may be assumed that the second output component $V_{QUAD\_out}$ maintains the aforementioned ideal value up to the falling edge of the pulse. Consequently, during the error-free period, i.e., following upon the falling edge of the pulse of the third control signal sRI, also the second input component $V_{QUAD\_in}$ is amplified correctly. From another standpoint, when the falling edge of the pulse of the third control signal sRI occurs, the second output component $V_{QUAD\_out}$ has a value equal to the aforementioned ideal value, which is equal to the product of the value $G_2$ and the value assumed by the second input component $V_{QUAD\_in}$ at the moment of the falling edge.

Once again with reference to FIG. 6, and without any loss of generality, it is also assumed that $G_1=-\frac{1}{2}$ and $G_2=-1$. Furthermore, for simplicity of representation, in FIG. 6 the correction of the error that afflicts the second output component $V_{QUAD\_out}$ occurs instantaneously, at the third instant $t_3$. Further, $\Delta t$ is widened with respect to a real situation, for a clearer representation.

For practical purposes, also the embodiment shown in FIG. 4 has a start-up time equal to half of the period of the first and second input components $V_{COR\_in}$ and $V_{QUAD\_in}$. Consequently, it guarantees the same advantages presented by the embodiment illustrated in FIG. 1.

Figure 7:
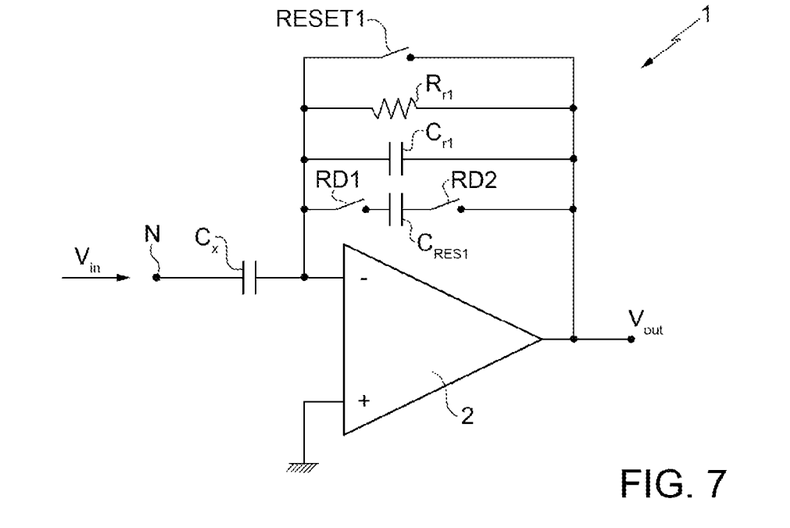

As shown in FIG. 7, further possible is an embodiment of the same type as the embodiment shown in FIG. 1, but where the output voltage $V_{out}$ supplied by the amplifier 2 is of a single-ended, instead of a differential, type; also in this case, the amplifier 2 may be constituted by an operational amplifier.

In what follows, the embodiment illustrated in FIG. 7 is described with reference to just the differences with respect to the embodiment shown in FIG. 1. Further, components already present in FIG. 1 are referred to using the same terms and the same references, except where otherwise specified.

In detail, the second output terminal of the amplifier 2 is absent. In other words, as mentioned previously, the amplifier 2 has an output of a single-ended type. In addition, the second input terminal of the amplifier 2 is connected to ground. Consequently, also the input configuration of the amplifier 2 is of a single-ended type. The second input capacitor $C_{i2}$, the second feedback capacitor $C_{r2}$, the second start-up capacitor $C_{RES2}$, the second feedback resistor $R_{r2}$, the second main switch RESET2, and the third and fourth secondary switches RD3, RD4 are thus absent, whereas the first input capacitor is designated by $C_x$ and has a value of capacitance, for example, equal to $C_1$. Consequently, we have $G_1=-C_1/(2 \cdot C_2)$ and $G_2=-C_1/C_2$. The input node N is formed by the terminal of the first input capacitor $C_x$ not connected to the amplifier 2.

For practical purposes, the amplifying circuit 1 shown in FIG. 7 functions in the same way as the amplifying circuit 1 shown in FIG. 1. Consequently, the values of capacitance $C_1$ and $C_2$ may be chosen in such a way as to obtain, for example, the same plots as those of the signals represented in FIG. 2.

Figure 8:
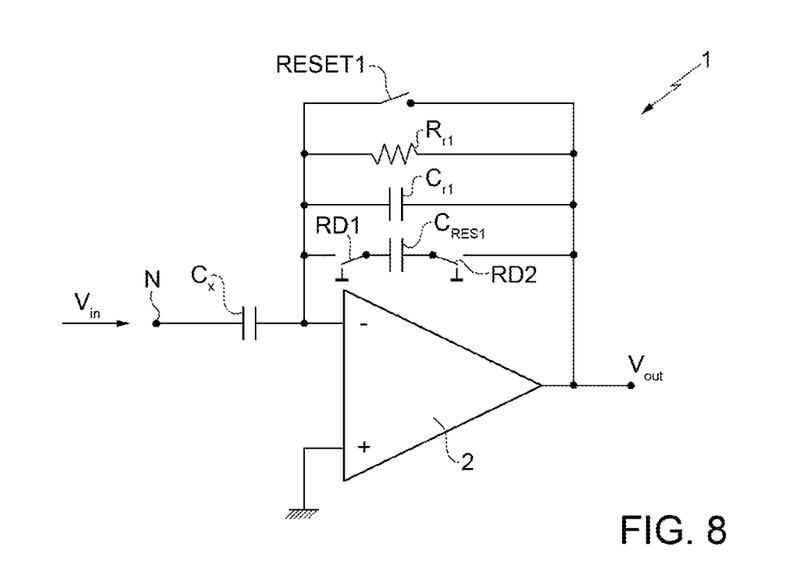

As shown in FIG. 8, further possible is an embodiment of the same type as the embodiment shown in FIG. 4, but where the output voltage $V_{out}$ is of a single-ended, instead of a differential, type. In what follows, the embodiment shown in FIG. 8 is described with reference to just the differences with respect to the embodiment shown in FIG. 4. Further, components already present in FIG. 4 are referred to using the same terms and the same references, except where otherwise specified.

In detail, the second output terminal of the amplifier 2 is absent. In other words, as mentioned previously, the amplifier 2 has an output of a single-ended type. Furthermore, the second input terminal of the amplifier 2 is connected to ground. The second input capacitor $C_{i2}$, the second feedback capacitor $C_{r2}$, the second start-up capacitor $C_{RES2}$, the second feedback resistor $R_{r2}$, the second main switch RESET2, and the third and fourth secondary switches RD3, RD4 are thus absent, whereas the first input capacitor is designated by $C_x$ and has a value of capacitance equal, for example, to $C_1$. Consequently, we have $G_1=-C_1/(2 \cdot C_2)$ and $G_2=-C_1/C_2$.

For practical purposes, the amplifying circuit 1 shown in FIG. 8 functions in the same way as the amplifying circuit 1 shown in FIG. 4. Consequently, the values of capacitance $C_1$ and $C_2$ may be chosen in such a way as to obtain, for example, the same plots as those of the signals represented in FIG. 6.

Considering each of the embodiments described previously and shown respectively in FIGS. 1, 4, 7, and 8, further possible is a corresponding embodiment in which the first control signal sRESET goes to zero when the second input component $V_{QUAD\_in}$ exhibits the first zero subsequent to power-up of the amplifier 2. In this case, when the second input component $V_{QUAD\_in}$ exhibits the second zero subsequent to power-up of the amplifier 2, it is found that the second control signal sRD goes to zero or else that the third control signal sRI generates the respective pulse, according to the embodiment considered. In other words, embodiments are possible in which the first and second/third control signals sRESET, sRD/sRI are synchronized with the zeros of the second input component $V_{QUAD\_in}$.

Figure 9:
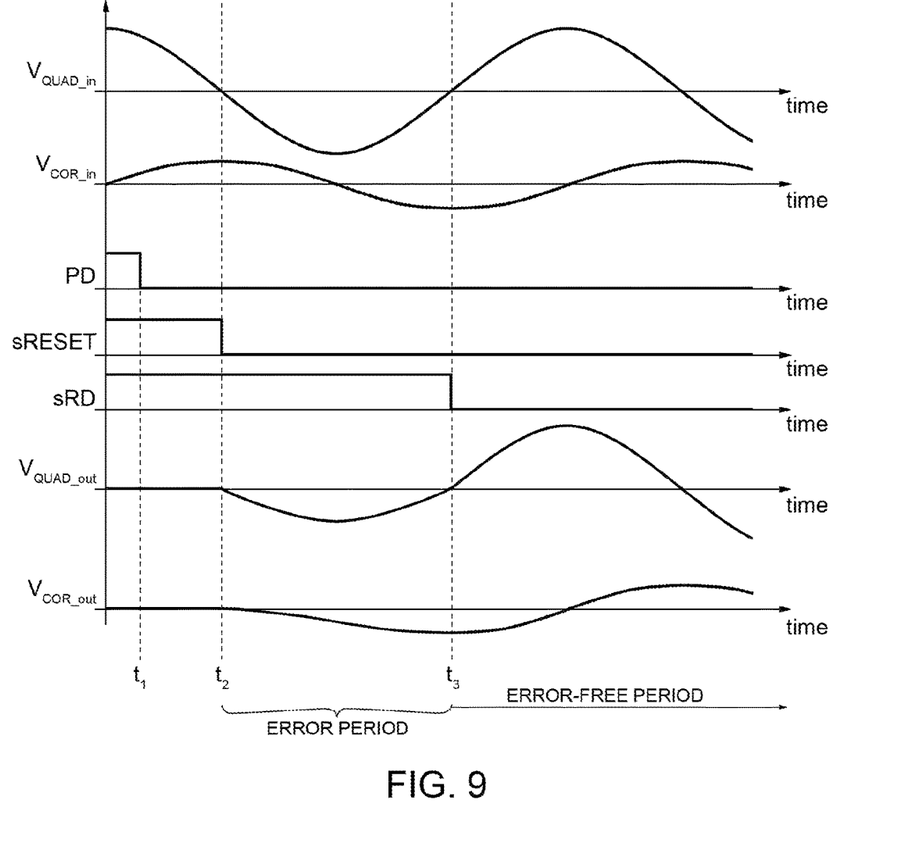
Figure 10:
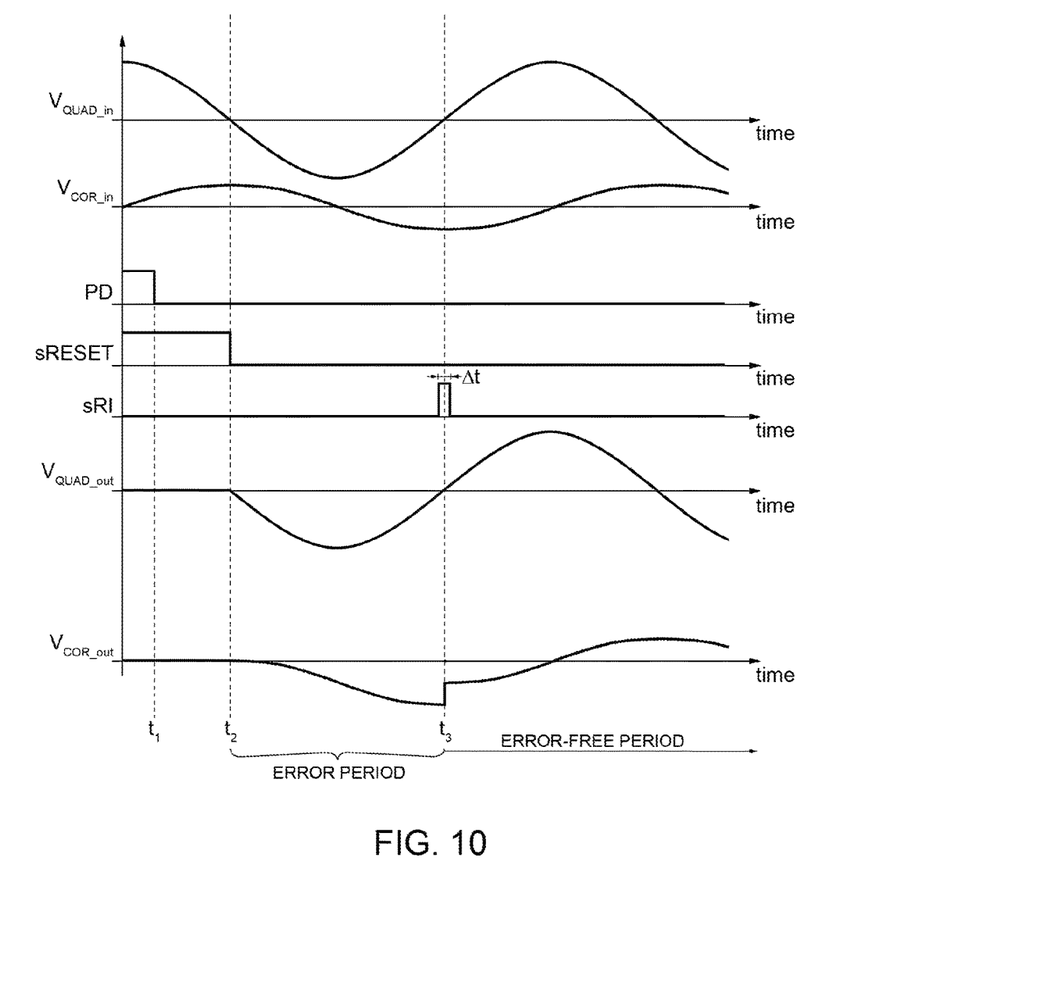

Examples of plots of signals regarding embodiments corresponding, respectively, to the embodiments shown in FIGS. 1 and 4, but where at the second and third instants $t_2$, $t_3$ there are zeros of the second input component $V_{QUAD\_in}$ are represented, respectively, in FIGS. 9 and 10. In this case, the considerations concerning the first and second output components $V_{COR\_out}$ and $V_{QUAD\_out}$, as regards the correctness of the gain and the presence of error, are reversed with respect to what has been described in connection with FIGS. 2 and 6.

Figure 11:
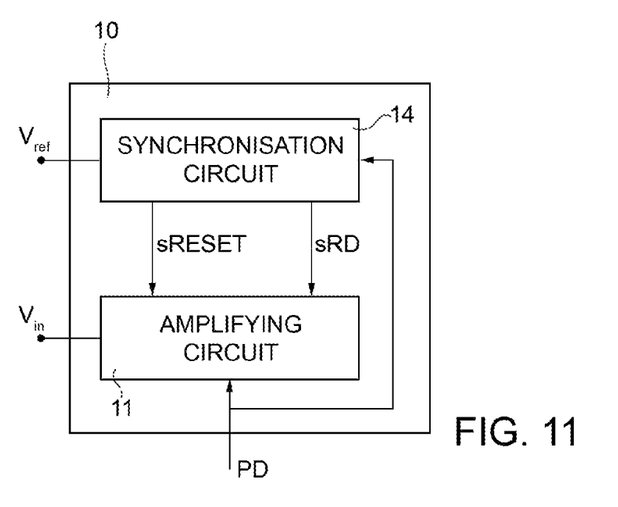
FIGS. 11 and 12 show block diagrams of integrated electronic circuits that include embodiments of the present amplifying circuit.
Figure 12:
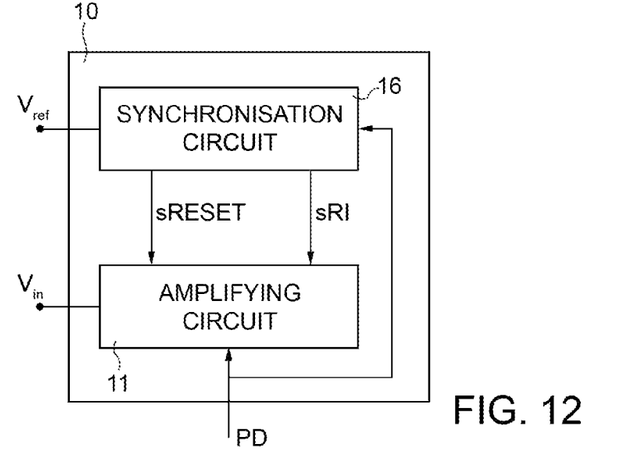

As shown in FIG. 11, it is possible to provide an integrated electronic circuit 10, which is for example a so-called ASIC (Application-Specific Integrated Circuit) and includes the synchronization circuit, here designated by 14, and the amplifying circuit, here designated by 11. Without any loss of generality, FIG. 11 regards the case where the amplifying circuit 11 is any of the ones described previously and controlled (among other things) by the second control signal sRD (which, as has been said, may be synchronized on a zero of the first or second input components $V_{COR\_in}$, $V_{QUAD\_in}$); thus, the synchronization circuit 14 is of the type represented in FIG. 3. As shown in FIG. 12, the amplifying circuit 11 may in any case be any of the ones described previously and controlled (among other things) by the third control signal sRI (which, as has been said, may be synchronized on a zero of the first or second input components $V_{COR\_in}$, $V_{QUAD\_in}$), in which case the synchronization circuit, designated by 16, is of the type represented in FIG. 5. In FIGS. 11 and 12, the output terminals of the amplifier 2 are not shown.

Irrespective of the integration in the integrated electronic circuit 10, further possible are embodiments corresponding to embodiments described previously, but where the first input capacitor (if the second input capacitor is absent) or both the first input capacitor and the second input capacitor have a capacitance that is variable in a way proportional to the signal given by the sum of the first and second input components $V_{COR\_in}$, $V_{QUAD\_in}$, in which case the input node N is set at a d.c. voltage. In other words, with reference, for example, to the amplifying circuit shown in FIG. 1, it is possible for the input node to be set at a constant voltage, and $\Delta C$ to be variable in a way proportional to the sum of the first and second input components $V_{COR\_in}$, $V_{QUAD\_in}$. Also in this case, in fact, there is a difference between the charges present on the first and second input capacitors $C_{in1}$, $C_{in2}$, said difference being subsequently amplified, with consequent generation of the output voltage $V_{out}$. In this connection, in the embodiments that include both the first input capacitor $C_{in1}$ and the second input capacitor $C_{in2}$, it is found that the respective charges have differential-mode components that vary in a way proportional to the sum of the first and second input components $V_{COR\_in}$, $V_{QUAD\_in}$, but with opposite signs. In the embodiments without the second input capacitor $C_{in2}$, the charge on the first input capacitor $C_{in1}$ varies in a way proportional to the sum of the first and second input components $V_{COR\_in}$, $V_{QUAD\_in}$.

Once again with reference to the integrated electronic circuit 10, it is further possible for some components of the amplifying circuit to be external to the integrated electronic circuit 10.

Figure 13:
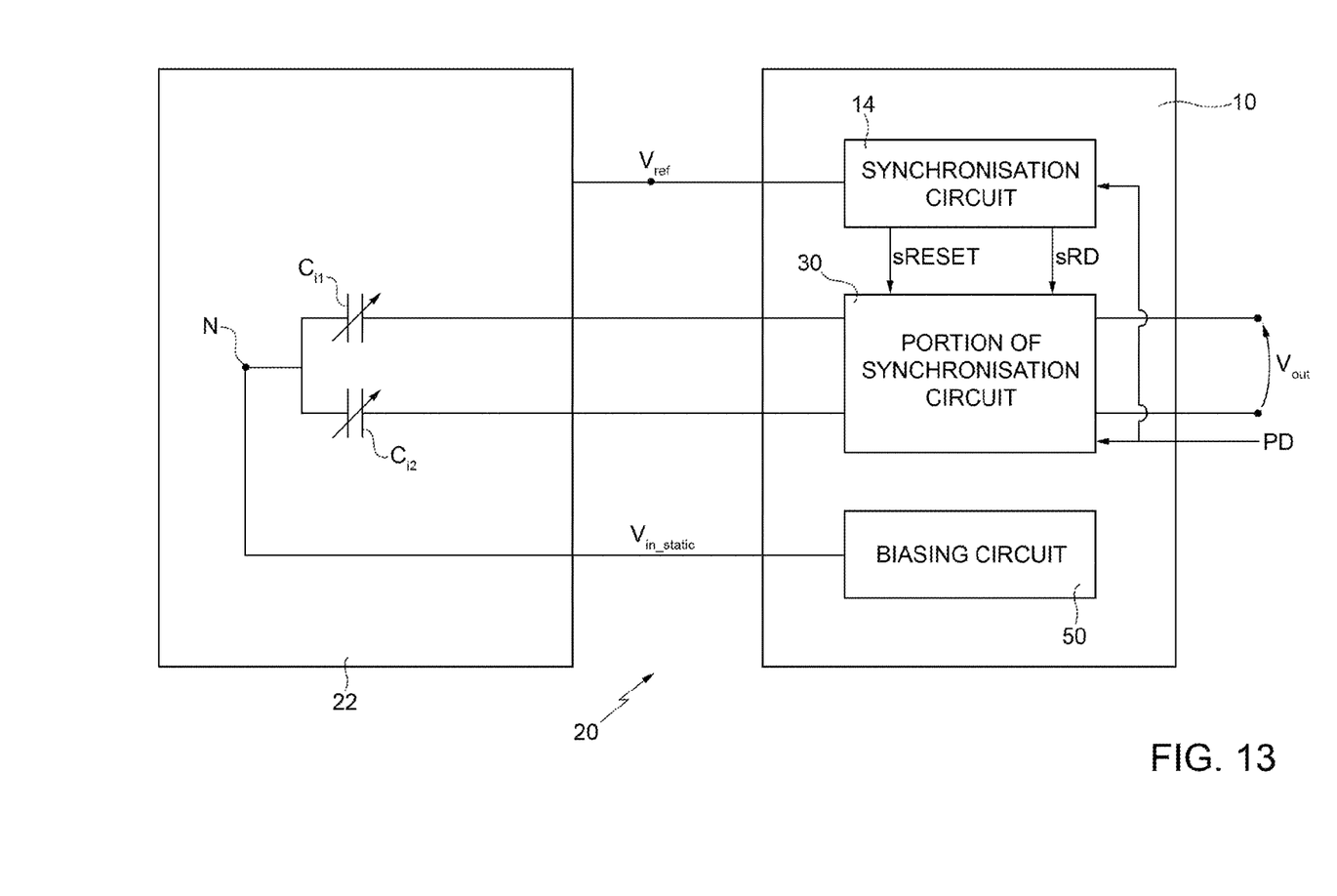
FIG. 13 shows a block diagram of an electronic system comprising a gyroscope.

For instance, FIG. 13 shows an electronic system 20, which comprises a gyroscope 22, which is connected to the integrated electronic circuit 10. More precisely, the first and second input capacitors $C_{i1}$, $C_{i2}$ are formed by the gyroscope 22, as also is the input node N. Without any loss of generality, FIG. 13 regards the case where the amplifying circuit 1 is of the type shown in FIG. 1, but for the fact that the gyroscope 22 varies $\Delta C$ in a way proportional to the sum of the first and second input components $V_{COR\_in}$, $V_{QUAD\_in}$. There are, however, possible electronic systems (not shown) in which the gyroscope 22 is coupled to any one of the embodiments described previously, such as for example the embodiment represented in FIG. 4.

In particular, with reference to FIG. 13, the synchronization circuit 14 is electrically connected to the gyroscope 22 for receiving the reference signal $V_{ref}$, which is generated by the gyroscope 22 to be in phase with the second input component $V_{QUAD\_in}$. In this connection, in the case of coupling with a gyroscope, the first and second input components $V_{COR\_in}$, $V_{QUAD\_in}$ are, respectively, formed by the so-called Coriolis component and the so-called quadrature component.

As shown once again in FIG. 13, the integrated electronic circuit 10 comprises a portion 30 of the amplifying circuit 1, which includes all the components of the amplifying circuit 1 represented in FIG. 1, but for the first and second input capacitors $C_{i1}$, $C_{i2}$. Furthermore, the integrated electronic circuit 10 comprises a biasing circuit 50, which has an output connected to the input node N and is designed to bias the input node N at a constant voltage $V_{in\_static}$. The biasing circuit 50 is of a per se known type and consequently is not described any further.

In general, irrespective of the possible coupling with the gyroscope 22 and thus irrespective of the presence of the first and second input capacitors $C_{i1}$, $C_{i2}$, the integrated electronic circuit 10 may be integrated in a single die. In the case of coupling with the gyroscope 22, the gyroscope may be formed in a die different from the die that forms the integrated electronic circuit.

From what has been described and illustrated previously, the advantages that the present solution affords emerge clearly.

In particular, the present solution makes it possible to reduce the start-up time, thus enabling power-up and power-down of the amplifier according to the energy-saving requirements, without this entailing the introduction of long periods in which the output signal is incorrect.

Furthermore, all the embodiments described may be integrated in contained areas, since they envisage the use of a very limited number of electronic components. Once again, the increase in energy consumption introduced by the present solution as compared to traditional architectures is substantially negligible.

In conclusion, it is clear that modifications and variations may be made to what has been described and illustrated so far, without thereby departing from the scope of the present disclosure.

For instance, the amplifier 2 may be formed by any amplifier of a known type with one or more stages. Furthermore, the amplifier 2 may be obtained using any known technology, and consequently may be made up, for example, of BJTs or MOSFETs.

The first and second feedback resistors $R_{r1}$, $R_{r2}$ may be implemented using corresponding MOSFETs, in which case the values of resistance may be varied.

Each of the switches described may be implemented in a per se known manner, for example using a corresponding MOSFET. As regards the pulse of the third control signal sRI, it may be arranged temporally in a way not perfectly aligned with respect to the third instant $t_3$, i.e., its center may be before or after the third instant $t_3$. Furthermore, it is possible for the third instant $t_3$ not to occur during the pulse of the third control signal sRI, in which case it is possible for it to be at a distance from the falling edge of the pulse (if delayed) or else from the rising edge of the pulse (if anticipated) by an amount less than, for example, 1/50 or else to 1/100 of the period of the first and second input components $V_{COR\_in}$, $V_{QUAD\_in}$.

All the digital signals may be reversed with respect to what has been described, in which case the corresponding switches controlled thereby are modified accordingly.

Finally, in principle the first and second feedback resistors $R_{r1}$, $R_{r2}$ could be absent; however, their presence enables faster recovery of possible errors of the first and second input components $V_{COR\_in}$, $V_{QUAD\_in}$, due for example to the tolerances of the components.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic circuit, comprising:
an amplifier including a first input terminal and a first output terminal, the first input terminal being configured to receive an input signal having first and second input components, the first and second input components having a same period and being in phase quadrature with respect to one another;
a first feedback capacitor coupled between the first input terminal and the first output terminal of the amplifier;
a first switch coupled between the first input terminal and the first output terminal of the amplifier;
a first resistor coupled between the first input terminal and the first output terminal of the amplifier; and
a first coupling circuit including a second switch, a third switch and a first startup capacitor, the second switch being coupled between the first input terminal of the amplifier and a first terminal of the first startup capacitor, the third switch being coupled between a second terminal of the first startup capacitor and the first output terminal of the amplifier.

2. The electronic circuit according to claim 1, said electronic circuit being configured to amplify said input signal as a function of a value of capacitance present between the first input terminal and the first output terminal of the amplifier.

3. The electronic circuit according to claim 1, the first coupling circuit being configured to selectively operate in a first and a second operating mode, wherein in the first operating mode the second and third switches are configured to couple the first startup capacitor in parallel to the first feedback capacitor, and in the second operating mode the second and third switches are configured to decouple the first startup capacitor from the first feedback capacitor.

4. The electronic circuit according to claim 3, wherein said first switch is configured to switch from a closed state to an open state in synchronization with a first zero crossing of one of the first and second input components, and wherein the first coupling circuit is configured to switch from the first operating mode to the second operating mode in synchronization with a second zero crossing of said one of the first and second input components.

5. The electronic circuit according to claim 1, wherein the first feedback capacitor and the first startup capacitor have a substantially same capacitance.

6. The electronic circuit according to claim 3, the amplifier further including a second input terminal and a second output terminal, the second input terminal being configured to receive the input signal, the electronic circuit further comprising: a second feedback capacitor coupled between the second input terminal and the second output terminal of the amplifier, the second feedback capacitor having a substantially same capacitance as the first feedback capacitor;
a fourth switch coupled between the second input terminal and the second output terminal of the amplifier; and
a second coupling circuit including a fifth switch, a sixth switch and a second startup capacitor, the fifth switch being coupled between the second input terminal of the amplifier and a first terminal of the second startup capacitor, the sixth switch being coupled between a second terminal of the second startup capacitor and the second output terminal of the amplifier, the second startup capacitor having a substantially same capacitance as the first startup capacitor,
wherein the second coupling circuit is configured to selectively operate in synchronization with the first coupling circuit in the first and second operating modes, wherein in the first operating mode, the fifth and sixth switches are configured to couple the second startup capacitor in parallel to the second feedback capacitor, and in the second operating mode the fifth and sixth switches are configured to decouple the second startup capacitor from the second feedback capacitor,
wherein the fourth switch is configured to operate in synchronization with the first switch.

7. The electronic circuit according to claim 3, wherein said first switch is configured to switch from a closed state to an open state in synchronization with a first zero crossing of one of the first and second input components, and the first coupling circuit is configured to operate in the second operating mode at said first zero crossing and to switch into the first operating mode for a time interval spanning a second zero crossing of said one of the first and second input components.

8. The electronic circuit according to claim 7, wherein said second said time interval is centered around and symmetrical with respect to said second zero crossing.

9. The electronic circuit according to claim 7, wherein said time interval has a temporal duration of less than 1/50 of said period.

10. The electronic circuit according to claim 7, wherein, in the second operating mode, the second and third switches of the first coupling circuit are configured to couple the first and second terminals of the first startup capacitor to a reference potential.

11. The electronic circuit according to claim 6, further comprising:
a second resistor coupled between the second input terminal and the second output terminal of the amplifier.

12. The electronic circuit according to claim 1, further comprising:
a synchronization circuit configured to receive an electrical reference signal in phase with one of said first and second input components, and to generate a first control signal for controlling said first switch and a second control signal for controlling said second and third switches of said first coupling circuit.

13. An electronic system comprising:
a gyroscope including first and second input capacitors; and
an electronic circuit coupled to the gyroscope, the electronic circuit including:
an amplifier including a first input terminal and a first output terminal, the first input terminal being configured to receive an input signal having first and second input components, the first and second input components having a same period and being in phase quadrature with respect to one another;
a first feedback capacitor coupled between the first input terminal and the first output terminal of the amplifier;
a first resistor coupled between the first input terminal and the first output terminal of the amplifier;
a first switch coupled between the first input terminal and the first output terminal of the amplifier; and
a first coupling circuit including a second switch, a third switch and a first startup capacitor, the second switch being coupled between the first input terminal of the amplifier and a first terminal of the first startup capacitor, the third switch being coupled between a second terminal of the first startup capacitor and the first output terminal of the amplifier.

14. The electronic system of claim 13 wherein the electronic circuit further includes:
a second feedback capacitor coupled between the second input terminal and the second output terminal of the amplifier;
a fourth switch coupled between the second input terminal and the second output terminal of the amplifier; and
a second coupling circuit including a fifth switch, a sixth switch and a second startup capacitor, the fifth switch being coupled between the second input terminal of the amplifier and a first terminal of the second startup capacitor, the sixth switch being coupled between a second terminal of the second startup capacitor and the second output terminal of the amplifier.

15. The electronic system according to claim 14, the electronic circuit being configured to selectively operate in a first and a second operating mode,
wherein in the first operating mode the second and third switches are configured to couple the first startup capacitor in parallel to the first feedback capacitor, and the fifth and sixth switches are configured to couple the second startup capacitor in parallel to the second feedback capacitor,
and wherein in the second operating mode the second and third switches are configured to decouple the first startup capacitor from the first feedback capacitor, and the fifth and sixth switches are configured to decouple the second startup capacitor from the second feedback capacitor.

16. The electronic system according to claim 13, wherein said first and second input components are respectively proportional to a Coriolis component and a quadrature component generated by the gyroscope.

17. A method of forming an electronic circuit, comprising:
coupling a first input terminal of an amplifier to a first input capacitor;
coupling a first feedback capacitor between the first input terminal and a first output terminal of the amplifier;
coupling a first resistor between the first input terminal and the first output terminal of the amplifier;
coupling a first switch coupled the first input terminal and the first output terminal of the amplifier;
coupling a second switch between the first input terminal of the amplifier and a first terminal of a first startup capacitor; and
coupling a third switch between a second terminal of the first startup capacitor and the first output terminal of the amplifier.

18. The method of claim 17, further comprising:
coupling a second input terminal of the amplifier to a second input capacitor;

coupling a second feedback capacitor between the second input terminal and a second output terminal of the amplifier;
coupling a fourth switch between the second input terminal and the second output terminal of the amplifier;
coupling a fifth switch between the second input terminal of the amplifier and a first terminal of a second startup capacitor; and
coupling a sixth switch between a second terminal of the second startup capacitor and the second output terminal of the amplifier.

19. The method of claim 18, further comprising:
coupling a second resistor between the second input terminal and the second output terminal of the amplifier.

20. The electronic system according to claim 14, further comprising:
a second resistor coupled between the second input terminal and the second output terminal of the amplifier.

21. A device, comprising:
an input capacitor;
an amplifier including an input terminal and an output terminal, the input terminal being directly electrically connected to the input capacitor, the input terminal, in use, receives an input signal having first and second input components which have a same period and are in phase quadrature with respect to one another;
a feedback capacitor coupled between the input terminal and the output terminal of the amplifier;
a first switch coupled between the input terminal and the output terminal of the amplifier; and
a coupling circuit including a second switch, a third switch and a startup capacitor, the second switch being coupled between the input terminal of the amplifier and a first terminal of the startup capacitor, the third switch being coupled between a second terminal of the first startup capacitor and the output terminal of the amplifier,
wherein, in use, the first switch is switched from a closed state to an open state in synchronization with a first zero crossing of one of the first and second input components, and the second and third switches are switched from a closed state to an open state in synchronization with a second zero crossing of said one of the first and second input components, the second zero crossing being sequential to the first zero crossing.

22. The device of claim 21, further comprising:
a synchronization circuit which, in use, receives an electrical reference signal in phase with one of said first and second input components, and generates a first control signal for controlling the first switch and a second control signal for controlling the second and third switches of the coupling circuit.

23. The device of claim 22 wherein the first control signal and the second control signal have respective frequencies that are less than a frequency of the input signal.

24. The device of claim 21, further comprising a resistor coupled between the input terminal and the output terminal of the amplifier.

25. An electronic circuit, comprising:
an amplifier including a first input terminal and a first output terminal, the first input terminal being configured to receive an input signal having first and second input components, the first and second input components having a same period and being in phase quadrature with respect to one another;
a first feedback capacitor coupled between the first input terminal and the first output terminal of the amplifier;
a first switch coupled between the first input terminal and the first output terminal of the amplifier; and
a first coupling circuit including a second switch, a third switch and a first startup capacitor, the second switch being coupled between the first input terminal of the amplifier and a first terminal of the first startup capacitor, the third switch being coupled between a second terminal of the first startup capacitor and the first output terminal of the amplifier, the first coupling circuit being configured to selectively operate in a first and a second operating mode, wherein in the first operating mode the second and third switches are configured to couple the first startup capacitor in parallel to the first feedback capacitor, and in the second operating mode the second and third switches are configured to decouple the first startup capacitor from the first feedback capacitor,
wherein said first switch is configured to switch from a closed state to an open state in synchronization with a first zero crossing of one of the first and second input components, and the first coupling circuit is configured to operate in the second operating mode at said first zero crossing and to switch into the first operating mode for a time interval spanning a second zero crossing of said one of the first and second input components,
wherein, in the second operating mode, the second and third switches of the first coupling circuit are configured to couple the first and second terminals of the first startup capacitor to a reference potential.

26. The electronic circuit of claim 25, further comprising:
a first resistor coupled between the first input terminal and the first output terminal of the amplifier; and
a second resistor coupled between the second input terminal and the second output terminal of the amplifier.

27. The electronic circuit of claim 25, further comprising:
a synchronization circuit configured to receive an electrical reference signal in phase with one of said first and second input components, and to generate a first control signal for controlling said first switch and a second control signal for controlling said second and third switches of said first coupling circuit.

28. An electronic circuit, comprising:
an amplifier including a first input terminal and a first output terminal, the first input terminal being configured to receive an input signal having first and second input components, the first and second input components having a same period and being in phase quadrature with respect to one another;
a first feedback capacitor coupled between the first input terminal and the first output terminal of the amplifier;
a first switch coupled between the first input terminal and the first output terminal of the amplifier;
a first coupling circuit including a second switch, a third switch and a first startup capacitor, the second switch being coupled between the first input terminal of the amplifier and a first terminal of the first startup capacitor, the third switch being coupled between a second terminal of the first startup capacitor and the first output terminal of the amplifier; and
a synchronization circuit configured to receive an electrical reference signal in phase with one of said first and second input components, and to generate a first control signal for controlling said first switch and a second control signal for controlling said second and third switches of said first coupling circuit.

29. The electronic circuit of claim 28, wherein the first coupling circuit is configured to selectively operate in a first and a second operating mode, wherein in the first operating mode the second and third switches are configured to couple the first startup capacitor in parallel to the first feedback capacitor, and in the second operating mode the second and third switches are configured to decouple the first startup capacitor from the first feedback capacitor.

30. The electronic circuit of claim 29, wherein said first switch is configured to switch from a closed state to an open state in synchronization with a first zero crossing of one of the first and second input components, and wherein the first coupling circuit is configured to switch from the first operating mode to the second operating mode in synchronization with a second zero crossing of said one of the first and second input components.

* * * * *